(12) United States Patent
Maso Portabella

(10) Patent No.: US 8,909,482 B2
(45) Date of Patent: Dec. 9, 2014

(54) DEVICE FOR MEASURING POWER CONSUMPTION AND PERFORMANCE WITH RESPECT TO THE ENVIRONMENT OF A POWER-CONSUMING UNIT

(76) Inventor: Alberto Maso Portabella, Cabrera de Mar (ES)

( * ) Notice: Subject to any disclaimer, the term of this patent is extended or adjusted under 35 U.S.C. 154(b) by 932 days.

(21) Appl. No.: 13/054,355

(22) PCT Filed: Jul. 20, 2009

(86) PCT No.: PCT/IB2009/053135
§ 371 (c)(1),
(2), (4) Date: Jan. 14, 2011

(87) PCT Pub. No.: WO2010/007601
PCT Pub. Date: Jan. 21, 2010

(65) Prior Publication Data
US 2011/0130972 A1   Jun. 2, 2011

(30) Foreign Application Priority Data

Jul. 18, 2008   (ES) .................................. 200802159

(51) Int. Cl.
| | |
|---|---|
| *G06F 19/00* | (2011.01) |
| *G01R 21/00* | (2006.01) |
| *G01D 4/00* | (2006.01) |
| *G07C 5/02* | (2006.01) |
| *G01R 22/10* | (2006.01) |

(52) U.S. Cl.
CPC .. *G01D 4/00* (2013.01); *G07C 5/02* (2013.01); *G01R 22/10* (2013.01); *Y02B 70/343* (2013.01); *Y04S 20/34* (2013.01)
USPC ................. 702/19; 702/45; 702/61; 705/7.39

(58) Field of Classification Search
CPC ............ G01D 4/00; G01R 22/10; G07C 5/02; Y02B 70/343; Y04S 20/34; G06Q 10/00; G06Q 10/063; G06Q 10/0639; G06Q 10/06393; G06Q 30/02
USPC ......... 702/19, 24, 45, 50, 57, 60, 61, 68, 179, 702/182, 183, 188; 705/7.11, 7.12, 7.39, 10
See application file for complete search history.

(56) References Cited

U.S. PATENT DOCUMENTS

2004/0117240 A1* 6/2004 Ness et al. ...................... 705/10

FOREIGN PATENT DOCUMENTS

WO   WO02/067152   8/2002

OTHER PUBLICATIONS

PCT International Search Report completed for PCT/IB2009/053135 Aug. 24, 2010.

* cited by examiner

*Primary Examiner* — John H Le
(74) *Attorney, Agent, or Firm* — Barnes & Thornburg LLP

(57) ABSTRACT

A device for measuring power consumption and performance relative to the environment of a power-consuming unit is disclosed. The device includes a data introduction module, a keyboard for inputting data of waste production in the power-consuming unit, a computing device, and a display screen. The computing device receives the data from the data introduction module and the keyboard. The computing device is also provided with a processor that includes a calculation algorithm of an ecological parameter indicative of the performance relative to the environment of the power-consuming unit. The ecological parameter is calculated as an adjusted mean of the sum of the deviations of each power consumption value with respect to a reference value.

16 Claims, 1 Drawing Sheet

DEVICE FOR MEASURING POWER CONSUMPTION AND PERFORMANCE WITH RESPECT TO THE ENVIRONMENT OF A POWER-CONSUMING UNIT

CROSS-REFERENCE TO RELATED APPLICATIONS

This application is a U.S. national counterpart application of International Application Serial No. PCT/IB2009/053135 filed Jul. 20, 2009, which claims priority to Spanish Patent Application No. P200802159 filed Jul. 18, 2008. The disclosures of PCT/IB2009/053135 and P200802159 are each hereby incorporated herein by reference.

TECHNICAL FIELD OF THE INVENTION

The invention refers to a device for measuring power consumptions and the respectful performance with the environment, from the measured power consumptions and from the residue production, in a power-consuming unit, a comfort unit (houses, communities, hotels and restaurants, spare time spaces, sport spaces, private and public motor vehicles, and goods vehicles, etc.) or a production unit.

The measurement of this respectful performance or not will be carried out by what we call "ecological parameter", from the measurements of power consumptions (direct consumptions) and of residues and wastes generated (indirect consumptions).

BACKGROUND OF THE INVENTION

A lot of kinds of programmable logic controllers (PLC) are known, in which, from state variables, the outputs of a system are determined (e.g. electrical or pneumatic, etc.) or another kinds of devices that, from inputs, calculate the values of parameters of interest. Examples of these devices can be the known analysers of the electric mains that, from voltage, current intensity and imbalance signals, calculate the electric power consumed by an installation.

However, in the current art no device or apparatus that calculates ecological parameters or magnitudes are known, from power consumption and waste production data in installations, if we define such parameters or magnitudes as a deviation of an optimal work point, defined by an authority. E.g. in which the emissions of COx or NOx are the minimum possible according to its use.

The present invention has the objective to provide an apparatus that fulfils this gap in the current art.

DESCRIPTION OF THE INVENTION

To this end, the object of the present invention is a new measuring device of power consumptions which calculates ecological parameters from the measured power consumptions and from data of waste production, that it is characterised in that it comprises:
- a module for introducing data, provided with at least an input of a value of power consumption of a magnitude, measured in a corresponding measure apparatus of the power-consuming unit;
- a keyboard for introducing data and for selecting menus, in particular data of waste production of the power-consuming unit;
- computing means that receive the data from the module for introducing data and from the keyboard, and which are provided with a processor that incorporates an algorithm for calculating an ecological parameter from the measured consumptions of power and from the introduced data; and
- a display screen, communicated with the computing means, to display the calculated ecological parameter, said ecological parameter being calculated as an adjusted mean of the sum of the deviations of each value of power consumption measured according to a reference value.

According to another feature of the present invention, the device comprises means for introducing values of waste production.

In preferred variants, the device can comprise an input module of a data bus of a domotic network and/or an USB input for a serial data bus.

In an embodiment of domestic or industrial application, the device comprises at least:
- an input of water flow, from a corresponding first water flow meter;
- an input of combustible gas or liquid flow, from a second flow meter of combustible gases or liquids;
- an input for measuring the electric power, from a counter or analyser of the electric mains; and
- an input for measuring the waste weight from a waste weighting scales.

In an alternative embodiment, for calculating the ecological parameter corresponding to the automobile, the device can comprise at least:
- an input of fuel flow, from a corresponding fuel flow meter of the motor of an automobile; and
- means for introducing the production of wastes of the automobile, selected among: tire rubber wastes, motor oil wastes, coolant liquid wastes, and liquid wastes from closed circuits, not being limitative, by the keyboard of the device.

The device can be provided also with an input for exhaust gases flow, from a corresponding flow meter of exhaust gases of the combustion system of the power-consuming unit, e.g. the motor exhaust; and a gas analyser for measuring the emission levels of gases and particles. The device compares the result obtained with the admitted levels by the current regulations. The incorrect combustion and the subsequent excess of gas ($CO_2$ and $NOx$) and particle emission is not a user o producer question, because they do not influence on it, but the direct responsible is the manufacturer of the apparatus or combustion chamber. However, additionally, the repair of said anomaly it is a question of the user or producer. This does not affect only to explosion motors and domestic boilers, but also to production and transformation centres.

Preferably, the device comprises a shell, which encloses the several components of the device, and in whose external part it is the keyboard and the screen.

BRIEF DESCRIPTION OF THE DRAWINGS

In the attached drawings some embodiments of the device object of the present invention are shown, only as a non-limitative example. In said drawings.

DETAILED DESCRIPTION OF THE DRAWINGS

In said drawings it can be seen the constitution and way of the device for measuring power consumptions and for calculating ecological parameters from the measured power consumptions, directly and indirectly.

The function of the device of the invention is to measure the respectful performance or behaviour with the environment of a "power-consuming unit". The "power-consuming unit" object of the measure of the possible different power manifestations consumed can be: a house, community (hotel, sports centre, residence, sport spaces, shops, department stores, leisure halls, office buildings and studies, administration centres, etc.), transformation centres, garages, warehouses, motor vehicles or transportation means, private or public.

The basis of the operation will consist in the comparison between the basic actual power flow required by the user for their comfort with the normal consumptions of the current regulations (e.g. UNE, ISO standards, etc.) and/or those recommended by official administrations of the place and/or statistic data of normal power consumptions and wastes (hereinafter "typical consumptions" including flows of power consumptions and wastes by person or by own unit of a preset population).

For this comparison, the proposed system will calculate an ecological parameter as an adjusted mean of the sum of deviations of each value of power consumption measured with respect to its corresponding reference value.

Figure 1:
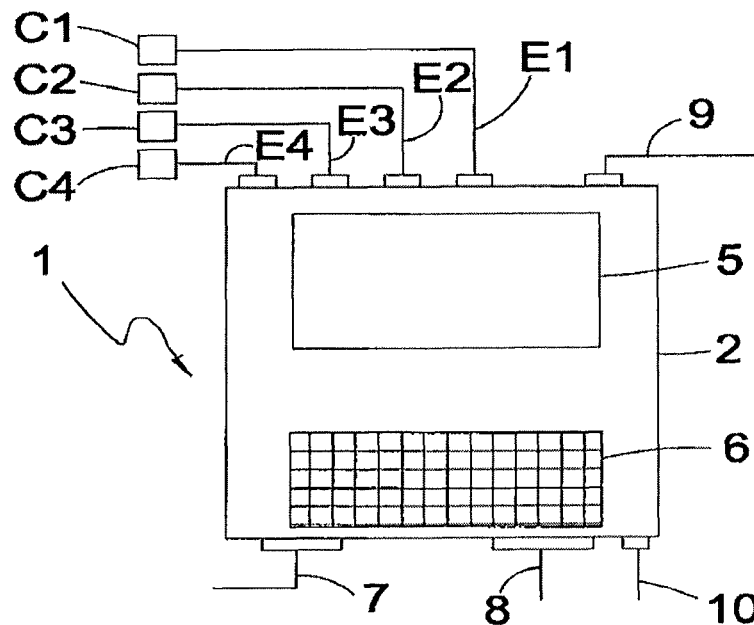
FIG. 1 is a diagrammatical frontal elevation view, that shows a device according to the present invention, with its particular connections.
Figure 2:
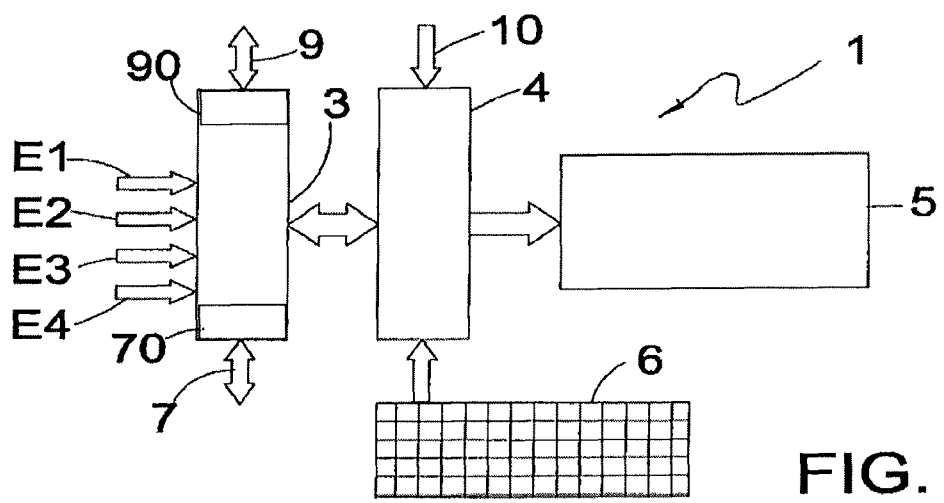
FIG. 2 is a block diagram that shows the internal composition of the device of FIG. 1.

To this end, as seen in FIGS. 1 and 2, the device 1 of the present invention is constituted by an apparatus that has a carcass or shell 2 that includes the following elements:

- a module for introducing data 3, provided with inputs of power consumption values E1, E2, E3, E4, of magnitudes, measured with corresponding measure apparatuses C1, C2, C3, C4;
- a keyboard 6 for introducing data and selecting menus, in particular data of the waste production;
- computing means 4, which receive the data from the module for introducing data 3 and the keyboard 6, and which are provided with a processor that includes a calculation algorithm for an ecological parameter from the measured power consumptions and from the introduced data; and
- a display screen 5, communicated with said computing means 4, to display the calculated ecological parameter.

The apparatus is provided with an electrical source 8, as it can be seen in FIG. 1.

To introduce values of the waste production one of the inputs E4, digital o analogical, can be used, from a weight apparatus, or they can be introduced manually through a keyboard 6.

The device 1 can be complemented with an input module 90 for a data bus 9 of a domotic network, and an USB input 70 for a serial data bus 7, or equivalent means.

In FIG. 1 a device particularly devised for special application in buildings (houses, hotel, sports centre, residence, sport spaces, shops, department stores, leisure halls, office buildings and studies, administration centres, transformation centres, garages, warehouses, etc.) is shown. The shell 2 comprises at least the following inputs:

- an input for the water flow E1 from a corresponding first water flow meter C1;
- an input for the flow of combustible gases or liquids E2, from the second flow meter of combustible gases or liquids C2;
- an input for measuring electric power E3, from a meter or analyser of electric mains C3; and
- an input for measuring the weight of the wastes E4 from a scale for weighting wastes C4, through the corresponding ports.

The number of inputs will be according to the complexity of the installation. E.g. an industry can be provided with several devices of this kind, each associated with a corresponding section or unit of factory, warehouse, office, etc.

Figure 3:
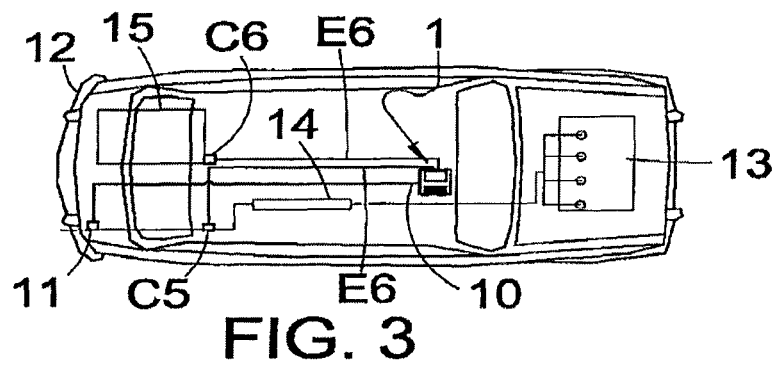
FIG. 3 is a diagrammatical view that shows an alternative embodiment of the invention, to be applied to automobiles.

In FIG. 3 is shown an embodiment particularly devised for automobiles, in which the device comprises an input for fuel flow E6, from a flow meter C6 of fuel, associated with the fuel deposit 15; and an input of exhaust gases flow E5, from a corresponding flow meter C5 of exhaust gases from the exhaust system 14 of the motor 13 of an automobile 12. In this case, by the keyboard the flows of production of wastes of the automobile are introduced manually, e.g. rubber wastes from tires, oil wastes for the motor, coolant liquid wastes, liquid wastes from closed circuits and metal wastes.

The device has an input 10 to collect, optionally, the information from a gas analyser 11 (FIG. 3), to measure the emission levels of gases and particles. The device 1 compares the result obtained with the levels admitted by the current regulations.

The algorithm of the computing means 4 calculates the total basic power flow obtained by the evaluation of the flows of the measured power statements E1, E2, E3, E4, E5, E6, etc. referred to the number of people which use the unit to be measured in each trip. The calculation algorithm integrates all the trips of a time period to be defined or the accumulated total.

Each flow has an incidence in the environment: the water consumption reverts in its exploitation, the fuel consumption is associated to the direct emissions of $CO_2$, $NO_x$, ..., the electric consumption to the indirect emissions of $CO_2$, $NO_x$, ..., and the waste production with indirect environmental impact, by the quantity of paper, glass, organic material, plastics, oils and greases, rubbers, metals, ... expressed in kg that the unit consumes per time unit and please who enjoy the comfort of said unit, to be compared with preset consumptions and wastes. These data, once treated by the algorithm, give as result an ecologic parameter (here denoted as "ecocom"), which is the measure of the conduct that respects our environment, to provide integral or combined or individual "ecocoms" of the comfort or production unit.

Regarding the presentation of the results, from said comparison the actual percentage of power consumption with respect to the preset consumption is obtained, indicating if the performance if respectful (equal to zero or higher) or abusive when it is negative. Both deviations are measured as a percentage. The percent unit of each flow is called positive "ecocom", if the result is respectful or negative if it is not. The algorithm of all the flows provides the integral "ecocom" of the unit. As there can be difficulties to receive all the flows, the algorithm of the ecometer could provide only "ecocoms" of water exploitation and/or direct gases emission and/or indirect gases emission and/or waste production. It is also possible to measure only those flows the public administration considers suitable to pay ecotaxes, evaluating a specific pack (which can be called "administrative ecocom").

The results are presented in a permanent way in a screen 5, indicating the periods of time on which they are based: the day, week, month accumulations, etc. or others, such as those consumed by trip in the case of vehicles. To know better the power exploitation, by a menu the "ecocoms" can be displayed (day, week, month, ...) of exploitation of the different power sources in the screen or to pass to other successive ones with the direct or indirect emissions or waste production.

As stated previously, if the consumption of only one or several flows are calculated for installation difficulties, the permanent screen shows that they are individual "ecocoms" by power source or waste, combined or integral.

Regarding the installation of different measuring apparatus C1, C2, C3, C4, C5, C6, etc., the water flow meter C1 is placed downstream the company meter and upstream the home key, with the possibility to emit impulses or analogical or digital or light signals. The same applies to C2, flow meter for combustible gases or liquids, to C3, electric measuring equipment in the general board of the unit, to C5, in the case of exhaust gases, and to C6, in the case of fuel flow of an automobile. The same can be said to the flow of waste production E4, which will be from a scale C4. The emission of information can be wireless or wired. In the case that there is no installation, by the keyboard 6 the flow data can be introduced manually.

Algorithm for Calculating the Ecologic Parameter

It results from the adjusted arithmetic mean of all the quotients between the absolute value of actual flows (E1, E2, E3, E4, E5, . . . ) that enter in the power-consuming unit object of the measure of the different possible power statements, with respect to their flows or corresponding reference values. The absolute value of the actual flows is taken because the input power consumption has a sign opposed to a waste, which indirectly is associated to another external power consumption;

therefore, as the contributions of each factor is the interesting part, all are taken in flow absolute value, no the quotient of flows, not being compensated to each other.

It is defined:

1—Flow of an actual input power statement (E1, E2, E3, E4, E5, E6 . . . , generally Ei): As the power quantity consumed by the time unit of that power statement, by user of the unit to be measured. E.g. the drinkable consumed in a home is a power flow because it is obtained from the nature with transportation, purification cost . . . ; these power costs are environmental costs associated with that consumed water. The combustible liquid and gas flow consumed is another actual input power flow associated with the direct emissions of CO2 and others to the atmosphere. The electricity consumption is another power flow associated with the indirect emissions of CO2 and other not desired gases. The wastes are also indicative of the environmental impact and they indicate indirectly a power expense. E.g. it is also an input power flow the quantity of glass we waste for identical reasons, but not those that we buy and remains for the development of the activity in the unit. Also with the paper, the organic material, the containers, the spare parts from repairs, etc.

2—Preset flows (Ct): They would be the average power consumption desired or recommended by the public administration of the zone where the activity of each unit to be measured is developed. If there is no environmental policy defined by the administration, standard consumptions or statistic data of consumptions are taken, inputs as consumption and outputs of wastes per resident or per production unit.

3—Adjustment coefficient (Cpd): Each coefficient designs a deviation percentage with respect to the preset consumption of consumed power statement. But not all have the same importance according to:

3.1. Habits regarding the consumptions of the unit. In certain regions there are power statements that have an important weight due to the proximity to the resource, subsidized prices or no other sources . . . . In these situations it must take into account the suitable specific weight that the administration determines or the statistical data. In the case of a motor vehicle, the water consumption will be dismissed, but not the fuel liquids or gases consumptions, the oil and grease wastes and rubber and metal wastes.

3.2. The power policies of the zone. According to the administration of the place and attending if to the environment conduct is associated a tax; these quotients must be adjusted depending on which deviations the administration could reward or punish.

3.3. Practical ends. These coefficients can be zero, because the contribution of said consumption is so low that is dismissed, according to the cost of its measure. E.g. the quantity of organic wastes of an electric train.

The adjusted coefficients are between 0 and 1.

Hence, the ecologic parameter (or "ecocoms", in %), for "n" magnitudes of power consumption or wastes, is calculated applying the formula:

$$Ecocoms(\%) = 1/n \sum_{i=1}^{n} \left( Cpdx \left(1 - \frac{Ei}{p \cdot Ct}\right) \right) \times 100$$

Wherein n is the number of power sources or waste variables to be measured (with adjustment coefficient different from zero) and p the people who enjoys the comfort of the unit to be measured.

Interpretation of the Results

The result is a percentage that when is close to zero the performance is desirable, but if it is negative and far away from zero, the performance of this unit is not respectful and the distance to zero is the degree of the separation from the desirable performance, and therefore it can be penalised and the penalization can be measured. Lastly, if it is positive the performance is excellent and the separation from zero is the measure of its environmental excellence.

The device for measuring power consumptions and the respectful performance, according to the present invention, can be used for the calculation of an ecologic parameter, which can be used as basis for the application of called ecotaxes by the administration.

What is claimed is:

1. A device for measuring power consumption and performance with respect to the environment of a power-consuming unit comprising
  a data introduction module, which receives at least one power consumption value, measured by a measurement apparatus of the power-consuming unit;
  an input device for inputting waste production data;
  a display screen; and
  a computer with a processor and a memory device having therein a plurality of instructions that, when executed by the processor, cause the processor to
  (a) receive the at least one power consumption value from the data introduction module,
  (b) receive the waste production data,
  (c) calculate an ecological parameter based on the at least one power consumption value and the waste production data, and
  (d) operate the display screen to display the calculated ecological parameter,
  wherein the calculated ecological parameter is an adjusted mean of the sum of the deviations of the at least one power consumption value with respect to a reference value corresponding to the at least one power consumption value.

2. The device of claim 1 further comprising a means for introducing values of waste production.

3. The device of claim 1 further comprising an input module of a data bus in a domotic network.

4. The device of claim 1 further comprising USB input for a serial data bus.

5. The device of claim 1 wherein the at least one power consumption value includes at least two power consumption values selected from the group of:
- a water flow input from a corresponding first water flow meter;
- a combustible gas and liquid flow input from a second combustible gas and liquid flow meter;
- an electric power measurement input from a meter or analyser of electric mains; and
- a waste weight measurement input from a scale for weighting wastes.

6. The device of claim 1 wherein the at least one power consumption value includes a fuel flow input from a corresponding flow meter from the motor of an automobile;
- the waste production data corresponds to one of tire rubber wastes, motor oil wastes, coolant liquid wastes, closed circuit liquid wastes and metal wastes, and
- the fuel flow input and the waste production data are used to calculate the ecological parameter corresponding to the automobile.

7. The device of claim 6 wherein the at least one power consumption value includes an exhaust gas flow input from a corresponding flow meter of exhaust gases of a combustion system of the automobile.

8. The device of claim 1 further comprising a shell, which encloses the different components of the device, and in whose external part is the input device and the display screen.

9. A method of determining an ecological parameter by processor, comprising:
- receiving a first power consumption value of a power consuming unit,
- receiving a waste production data value,
- determining an ecological parameter based on the first power consumption value and the waste production data value, and
- outputting the determined ecological parameter for display on a display screen.

10. The method of claim 9, wherein the first power consumption value corresponds to one of water flow, combustible gas flow, and electric power flow.

11. The method of claim 10, wherein the waste production data corresponds to waste weight.

12. The method of claim 9, wherein the first power consumption value corresponds to one of fuel flow and exhaust gas flow.

13. The method of claim 12, wherein the waste production data corresponds to one of rubber wastes, oil waste, coolant liquid wastes, and metal.

14. The method of claim 12, further comprising generating a positive ecological parameter when a user expends less than a predetermined standard quantity of power consumed in a time period.

15. The method of claim 9, further comprising generating a negative ecological parameter when a user expends more than a predetermined standard quantity of power consumed in a time period.

16. The method of claim 9, wherein the ecological parameter is determined as a percentage based on an algorithm of the form $$\text{Parameter}(\%) = 1/n \sum_{i=1}^{n} \left( Cpdx \left(1 - \frac{Ei}{p \cdot Ct}\right) \right) \times 100$$

wherein "Ei" is a power quantity consumed in a time period,
"Ct" is a predetermined standard quantity of power consumed in the time period,
"Cpd" is a coefficient corresponding to the predetermined standard quantity of power consumed in the time period,
"n" is a sum of a number of measured power sources and waste variables, and
"p" is a number of users of the measured power sources and waste variables.

* * * * *